United States Patent [19]

Larsen

[11] Patent Number: 4,929,892
[45] Date of Patent: May 29, 1990

[54] PROCESS FOR ELECTRICALLY TESTING A COMPONENT IN TRANSIT TO ASSEMBLY AND COMPONENT TEST CHUCK

[75] Inventor: Alan B. Larsen, Provo, Utah

[73] Assignee: Hughes Aircraft Company, Los Angeles, Calif.

[21] Appl. No.: 309,463

[22] Filed: Feb. 9, 1989

[51] Int. Cl.[5] .......................... G01R 31/02; G01R 1/06
[52] U.S. Cl. ............................... 324/158 F; 324/158 P
[58] Field of Search .......... 324/73 AT, 73 PC, 158 F, 324/158 P

[56] References Cited

U.S. PATENT DOCUMENTS

| | | | |
|---|---|---|---|
| 4,212,075 | 7/1980 | Cleversey et al. | 324/73 A T |
| 4,500,003 | 2/1985 | Cedrone | 324/158 F |
| 4,721,907 | 1/1988 | Dean et al. | 324/73 P C |
| 4,772,846 | 9/1988 | Reeds | 324/158 F |

FOREIGN PATENT DOCUMENTS 0162207 11/1985 European Pat. Off. ........ 324/158 F

Primary Examiner—Ernest F. Karlsen
Attorney, Agent, or Firm—Leonard A. Alkov; Wanda Denson-Low

[57] ABSTRACT

The process comprises the testing of an electrical component during transit from a pickup position to its attachment position. The process may be accomplished by the use of a component test chuck (30) which has four pivoted arms (66, 68, 70, 72), each carrying a finger (90, 92, 94, 96). The fingers are sized and positioned for engaging on and retaining an electrical component. Two of the fingers have tips (102, 104) which are electrically conductive and are connected to a test unit (106) so that the component (93) can be tested in transit between the pickup point and the placement point.

12 Claims, 2 Drawing Sheets

PROCESS FOR ELECTRICALLY TESTING A COMPONENT IN TRANSIT TO ASSEMBLY AND COMPONENT TEST CHUCK

FIELD OF THE INVENTION

This invention is directed to a process for testing an electrical component after it is picked up by a chuck while it is in transit to mounting position, and to a test chuck which is useful in a pick-and-place machine to implement the process.

BACKGROUND OF THE INVENTION

Automatic assembly machines are widely used in the assembly of components onto printed wiring boards. The printed wiring board is positioned and the placement program of the assembly machine directs the machine to pick up components and place them in the correct orientation and position on the printed wiring board. Many printed wiring boards have quite a number of components assembled thereon, and thus it is desirable to test the components before they are permanently secured in place. The later the test occurs in the assembly sequence, the higher the reliability because there is a lower chance of part damage or part mixup after the test. Thus, it is conventional for the pick-and-place machine to pick up a component which is thought to be a correct and operative component. This component is taken to a test position where it is tested to determine that the component is correct and operative. Thereupon, it is picked up and positioned at its attachment position on the printed wiring board. After such positioning on the printed wiring board, it is permanently secured, as by reflow soldering. The pickup of the component and the movement of the component to the test position, followed by the discrete step of testing the component, again picking up the component and moving it to its attachment position, and placing it thereon is a multi-step process which can be simplified. Simplification can be achieved by testing the component while it is in transit between the pickup position and the attachment position This eliminates the placement of the component at the test station and the subsequent pickup of the component at that station. Machine time is reduced by eliminating the intermediate step of placement in the test position and the consequent possible mixup of parts at the test position, it is desirable to test the component while it is in route between the pickup position and the placement position, thereby also eliminating a discrete station.

SUMMARY OF THE INVENTION

In order to aid in the understanding of this invention, it can be stated in essentially summary form that it is directed to a process for electrically testing an electrical component in transit to an attachment position and to a component test chuck for mounting on a transfer arm so that a component picked up by the chuck can be tested between the pickup station and the ultimate placement location on the printed wiring board.

It is thus a purpose and advantage of this invention to provide a process by which an electrical component is tested in transit to an assembly position so that the test step is accomplished immediately before the placement of the component in the assembly position.

It is another purpose and advantage of this invention to provide a component test chuck for placement on a transfer arm so that an electrical component can be tested in route between a pickup station and a position where it is placed.

It is another purpose and advantage of this invention to increase assembly reliability by the process of testing a component in route, rather than place it at an intermediate test station.

It is another purpose and advantage of this invention to reduce machine time to increase assembly speed by testing an electrical component in route between the pickup point and the placement point to eliminate a fixed test station and a transfer arm stop at the test station.

Other purposes and advantages of this invention will become apparent from a study of the following portion of this specification, the claims and the attached drawings wherein:

DESCRIPTION OF THE PREFERRED EMBODIMENT

Figure 3:
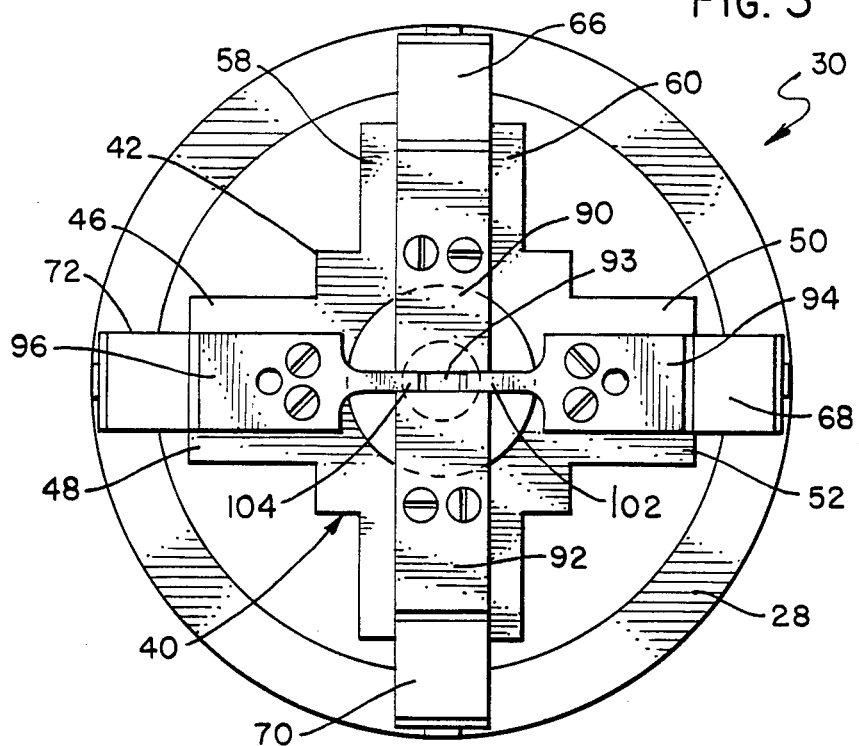
FIG. 3 is a bottom view thereof.
Figure 4:
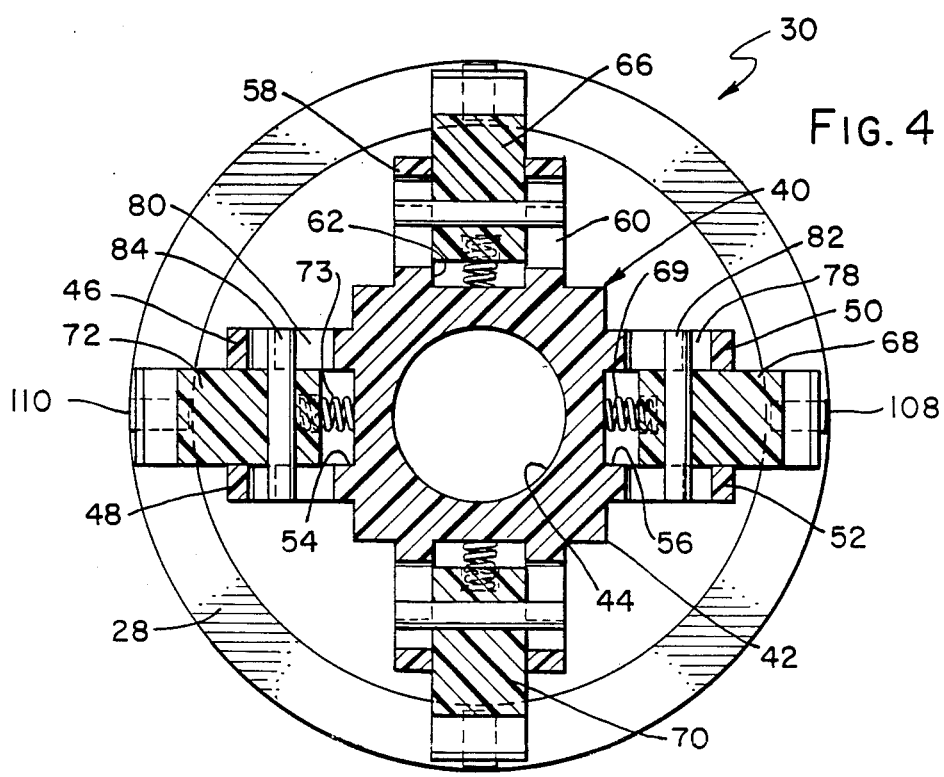
FIG. 4 is an upwardly looking section therethrough, through, as seen generally along the line 4—4 of FIG. 2.

The process of this invention will be described as being accomplished by a pick-and-place machine or automatic assembly machine 10 which employs the component test chuck, 30 as generally indicated at 10 in FIG. 1. The machine 10 has a base 12 which carries table 14 on which is mounted the device on which components will be placed. In the present instance, the device is printed wiring board 16. The machine 10 has a bridge 18 which is movable forward and back in FIG. 1 on rails 20 and 22. Carriage 24 is mounted for left and right positioning along the bridge. Post 26 is mounted on the carriage for up and down motion. Thus, the carriage can move the post in rectangular X and Y directions, corresponding to motion of the bridge on the rails and the carriage on the bridge. Z-motion of the post is preferably at right angles to the other axes for convenience in programming. Thus, the post can be moved over an active area. Post 26 has a collar 28 thereon for actuation of chucks held by the post. Chuck 30, in accordance with this invention and illustrated in more detail in FIGS. 2, 3 and 4, is shown as mounted on the post in FIG. 1. The machine is programmed so that it can pick up the chuck 30, or alternatively pick up one of the chucks 32 and 34 positioned on base 12.

The control computer, which is mounted within base 12, positions the carriage and post to pick up the appropriate chuck. Appropriateness of the chuck is determined by the size and shape of the chuck fingers for picking up and placing particular components. Four component trays are provided, and these are seen under the bridge 18 positioned where it is in FIG. 1. Component trays 36 and 38 are particularly identified. The machine moves the chuck 30 to the tray having the selected part, picks up the part, tests it in route, and places it in the proper location and proper orientation on printed wiring board 16. The manner in which the component is held and tested is in accordance with the teachings of the component test chuck of this invention.

Figures 1, 2:
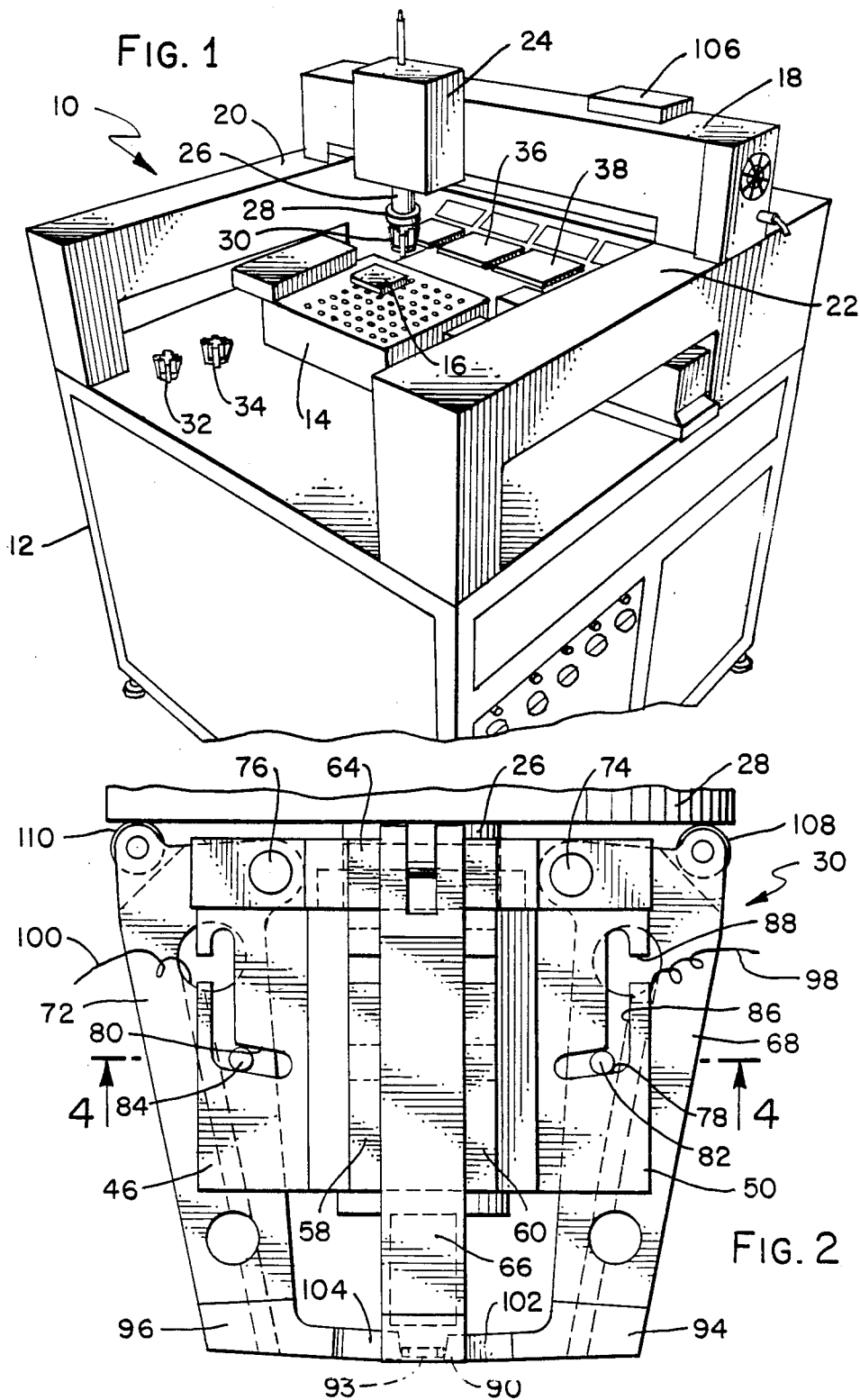
FIG. 1 is a perspective view of a pick-and-place machine with, the test chuck of this invention associated therewith.
FIG. 2 is an enlarged side-elevational view of the test chuck in accordance with invention.

Referring to FIGS. 2, 3 and 4, the component test chuck 30 has an interior member 40 which has a square central section 42. The square central section 42 has an interior circular opening 44 which is sized and shaped to be grasped by the post 26. It is the engagement of post 26 in the interior opening 44 which causes the pickup of the chuck and its positioning. The square central section 42 has four pairs of flanges thereon. Flanges 46 and 48 are parallel to each other and extend in the direction of the axis defined by the interior circular opening. On the right side, as seen in FIGS. 3 and 4, flanges 50 and 52 are axially directed, spaced from each other, and define a slot therebetween. Slot 54 is defined between flanges 46 and 48, while slot 56 is defined between flanges 50 and 52. Additionally, flanges 58 and 60 extend toward the viewer in FIG. 2 and define slot 62 therebetween, as seen in FIG. 4. These pairs of flanges are arranged at right angles to each other, and there is a fourth pair of flanges, as seen in FIG. 4, also at right angles and axial so that four slots are defined at right angles to each other. It is in these slots that the chuck fingers engage.

Holder 64, see FIG. 2, has the same lateral outline as the interior member 40 and thus cannot be seen in the upwardly looking views of FIGS. 3 and 4. It is holder 64 that pivotally carries the four arms 66, 68, 70 and 72, seen in FIGS. 3 and 4. Pivot pins 74 and 76 respectively for arms 68 and 72 are shown in FIG. 2. The holder 64 could be formed as the same piece as interior member 40, but for other convenience, it is a separate part.

The arms 66-72 are preferably made of dielectric material. Slots are formed in the flanges, with slots 78 and 80 shown in FIGS. 2 and 4. Pins 82 and 84 are engaged through the arms 68 and 72, respectively, and are engaged in the slots in the flanges. The arms lie between the flanges, and the pins limit outward rotation of the arms around their pivot pins 74 and 76. The arms are urged outwardly to spread their lower ends by means of compression springs in pockets in the arms engaging against the central section 42. As seen in FIG. 4, compression spring 69 is mounted in a pocket in arm 68 and urges the arm away from the central section 42. Similarly, compression spring 73 is mounted in a pocket in arm 72 and engages against the central section 42. Similar springs are mounted in pockets in arms 66 and 70. While two arms are thus described with respect to FIGS. 2 and 4, it is clear that all four arms are thus pivoted and limited in rotation by pins engaging in slots in the flanges. The flanges also serve as lateral guides for the arms to control their position because the arms are closely fit between the flanges. For disassembly, the pins 74 and 82 can be driven out to permit removal of the arm 68, for example. However, with the holder 64 separate from the interior member 40, disassembly is achieved by raising holder 64 and permitting the pin 82 to rise up in slot 86 and out of opening 88. In this way, disassembly can be achieved. Such a structure is provided for each of the four arms, and thus lifting of holder 64 with respect to interior member 40 and spreading of the arms permits removal of the arms from the central member.

The arms 66 and 70, as seen in FIG. 3, have broad fingers 90 and 92 secured to the lower end thereof, as by screws. These fingers are sized to contact the side of the component 93, which is being transported and tested. Fingers 90 and 92 are dielectric. Fingers 94 and 96 are respectively secured to the lower ends of arms 68 and 72, as by screws. The fingers 94 and 96 are of contact metal, such as hard copper, and are electrically connected to lines 98 and 100, which are seen in FIG. 2. The fingers 94 and 96 have narrow tips 102 and 104, which extend between the fingers 90 and 92 to engage on the ends of the component 93. The component 93 has surfaces on the end thereof which represent the electrical contacts so that the fingertips 102 and 104 are in electrical contact with the contact ends of the component. Lead openings are shown in dashed lines in FIG. 2 by which the lines 98 and 100 extend from the contact fingers out of the component chuck. The leads are connected to test unit 106, see FIG. 1.

The process of testing in transit may be achieved by the above-described structure or may be achieved by other similar structure. Test unit 106 is related to the program in the machine 10 so that, when a component is picked up, test unit 106 is energized to test the component 93 within the fingers of the component test chuck 30 of this invention. Closure of the fingers on the component being picked up is accomplished by downward movement of the collar 28 against the rollers at the top outer corners of the arms. Rollers 108 and 110 are shown in FIG. 2 with respect to arms 68 and 72. In accordance with this process, a component to be placed is picked up, tested while in route, and placed on printed wiring board 16 in its proper location so that the assurance of a correct and operative component is obtained.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A component test chuck for use on a transfer arm comprising:
   a holder, said holder having first, second, third and fourth pairs of flanges extending therefrom;
   at least four pivot openings on said holder, first, second, third and fourth pivot pins respectively in said pivot openings in said holder, said first and second pivot pins being opposite each other and on substantially parallel axes, and said third and fourth pivot pins being opposite each other and on substantially parallel axes to each other and at substantially right angles to the axes of said first and second pivot pins;
   first and second arms mounted between said first and second pairs of flanges on said first and second pivot pins, said third and fourth arms respectively pivotally mounted between said third and fourth pairs of flanges on said third and fourth pivot pins;
   a collar, cam follower means on each of said first, second, third and fourth arms for being engaged by said collar for thrusting said arms in a direction to rotate said arms on said pivot pins to close said fingers toward each other;
   first and second fingers respectively mounted on said first and second arms and third and fourth fingers respectively mounted on said third and fourth arms, said fingers being sized to grasp an electrical component when said arms are pivoted on said pivot pins in a direction to move said fingers toward each other, said first and second fingers being dielectric and said third and fourth fingers being electrically conductive so that a component grasped between said third and fourth fingers can be electrically tested.

2. The component test chuck of claim 1 further including a test unit electrically connected to said third and fourth fingers to electrically test a component held therebetween.

3. The component test chuck of claim 2 wherein said first, second, third and fourth arms are made of dielectric material.

4. The component test chuck of claim 1 wherein said pivot pins each extends through a pair of flanges and through the arm positioned therebetween.

5. The component test chuck of claim 3 wherein there is a member adjacent said holder and said member is configured to be engaged by a transfer arm on a positioning machine, said arms being limited in rotational movement around said pivots by said member.

6. The component test chuck of claim 5 wherein there is a pin in slot engagement between said arms and said member to limit rotative motion of said arms with respect to said member and with respect to said holder.

7. A component test chuck for use on the transfer arm of a positioning machine, said component test chuck comprising:
 a holder for being carried by a positioning machine;
 first, second, third and fourth arms pivotally mounted on said holder;
 first, second, third and fourth fingers respectively mounted on said first, second, third and fourth arms, said arms being pivoted so that said fingers come together for holding a component to be transferred and tested;
 a collar movably mounted with respect to said holder, first, second, third and fourth cam followers respectively mounted on said first, second, third and fourth fingers away from said pivots, said cam followers being engageable by said collar for closing all said fingers on a component to engage a component to be transferred and tested;
 said first and second fingers being dielectric and said third and fourth fingers being electrically conductive, said third and fourth fingers being connected to a test unit for electrically testing a component engaged between said fingers.

8. The component test chuck of claim 7 wherein said holder has first, second, third and fourth pairs of flanges extending therefrom and said first, second, third and fourth arms are movably mounted between said flanges.

9. The component test chuck of claim 8 wherein there are first, second, third and fourth pivot pins respectively engaging through said first, second, third and fourth pairs of flanges and said first, second, third and fourth arms so that said arms are pivotally mounted with respect to said holder.

10. The component test chuck of claim 8 wherein there is stop means connected to said arms to limit the motion of said arms.

11. The component test chuck of claim 10 further including a member, said member and said arms having pins and slots thereon so as to limit motion of said arms with respect to said member, said member being positioned adjacent said holder.

12. The component test chuck of claim 11 wherein said member is configured for engagement by the transfer arm on a positioned machine so that said component test chuck may be picked up and released by the transfer arm.

* * * * *